United States Patent

Yeo et al.

Patent Number: 5,981,387
Date of Patent: Nov. 9, 1999

[54] METHOD FOR FORMING SILICIDE FILM IN SEMICONDUCTOR DEVICE

[75] Inventors: Tae-Jung Yeo, Kyoungki-do; Hyug-Jin Kwon, Seoul, both of Rep. of Korea

[73] Assignee: Hyundai Electronics Industries Co., Ltd., Kyoungki-do, Rep. of Korea

[21] Appl. No.: 08/953,173

[22] Filed: Oct. 17, 1997

[30] Foreign Application Priority Data

Oct. 23, 1996 [KR] Rep. of Korea ................... 96/47828

[51] Int. Cl.$^6$ .................................................... H01L 21/44
[52] U.S. Cl. ................ 438/682; 438/683; 438/649; 438/650; 438/651; 438/655; 427/99; 427/126.1; 427/255; 427/255.1; 427/255.2; 148/19; 148/147
[58] Field of Search ........................ 438/683, 682, 438/649, 650, 651, 655; 427/99, 126.1, 255, 255.1, 255.2; 148/DIG. 19, DIG. 147

[56] References Cited

U.S. PATENT DOCUMENTS

| | | | |
|---|---|---|---|
| 5,203,956 | 4/1993 | Hansen | 156/643 |
| 5,726,096 | 3/1998 | Jung | 438/592 |
| 5,856,237 | 1/1999 | Ku | 438/683 |

*Primary Examiner*—John F. Niebling
*Assistant Examiner*—David A. Zarneke
*Attorney, Agent, or Firm*—Ware, Fressola, Van Der Sluys & Adolphson LLP

[57] ABSTRACT

Disclosed is a method for forming a silicide film on bit lines or word lines in a semiconductor device. The method includes the steps of: placing a substrate within a reacting chamber, the substrate having an objective layer on which a metal silicide film is to be formed; and supplying a first source gas for silicon component of the metal silicide and a second source gas for metal component of the metal silicide into the reacting chamber with maintaining a flow rate of the first source gas and with varying a flow rate of the second source gas, wherein the first and second source gases are discretely supplied into the reacting chamber, a reacting zone of the reacting chamber being maintained at a constant temperature range for a selected time.

11 Claims, 2 Drawing Sheets

METHOD FOR FORMING SILICIDE FILM IN SEMICONDUCTOR DEVICE

BACKGROUND OF THE INVENTION

1. Field of the Invention

The present invention generally relates to a method of a silicide film in a semiconductor device, and more particularly to a method of a silicide film used in the manufacture of semiconductor integrated circuits such as schottky barriers, ohmic contacts and gate metallization.

2. Description of the Related Art

Generally, silicide films are compound of silicon and transition metal such as titanium(Ti), tantalium(Ta), tungsten(W), silver(Ag), and Gold(Ag), the films being used in the manufacture of semiconductor integrated circuits such as schottky barriers, ohmic contacts and gate metallization. These films are formed through a method of depositing one among the above mentioned transition metals on an objective layer of silicon or polysilicon layer, followed by thermal treatment at selected temeprature range and time range, or are formed through another method of forming silicide film directly on the objective layer.

Silicide film formed by any one of the above methods can be applied on top of a polysilicon layer used as bit lines or word lines, to form a layered structure called a "polycide" structure and it can also substitute polysilicon layer itself used as bit lines or word lines.

FIG. 1 is a partial sectional view of a semiconductor device in which tungsten silicide($WSi_x$) film is formed on a semiconductor substrate.

Referring to FIG. 1, in order to form $WSi_x$ film in accordance with a conventional technology using chemical vapor deposition method, a substrate 1 having an objective layer on which $WSi_x$ film is to be formed, is introduced into a reacting chamber and is set in the deposition zone of the reacting chamber. Afterwards, reactant gases including monosilane ($SiH_4$) as source gas of silicon and tungsten hexa-fluoride ($WF_6$) gas as source gas of tungsten are introduced into the reacting chamber, for the formation of $WSi_x$ film 2. At this time, the inside of the chamber is maintained at a specific temperature. The reactant gases is lastly supplied without the supply stop of the source gases until thickness of $WSi_x$ film approaches an objective value.

FIG. 2 shows AUGER analysis results of $WSi_x$ film deposited on polysilicon layer used as bit lines or word lines, horizontal axis being a sputter time taken in etching $WSi_x$ film from its surface to the bottom of the $WSi_x$ film and vertical axis being atomic concentration Si and W component in $WSi_x$ film formed.

Referring to FIG. 2, a mole ratio of tungsten to silicon (W:Si) in the $WSi_x$ film is not uniform through the thickness of the film. In further detail, in region II where the sputter time is about 6 seconds to 13 seconds, the ratio is 1:2.2–2.3 while in regions I and III, the ratio is 1:1.8–2.2, it being below the optimal range of 1:2.0–2.8. From the ratio obtained, the silicide films formed in regions I and III are assumed to be an unstable stoichiometry phase. On measuring the resistivity, the film does not have a desired value. Thus, the conventional method does not contribute to an enhancement in a characteristic of the semiconductor device.

SUMMARY OF THE INVENTION

Accordingly, it is an object to provide a method for forming a silicide film in a semiconductor device, the silicide film having a uniform tungsten to silicon ratio through the thickness of the formed silicide film.

To accomplish the above object, there is provided a method for forming a silicide film in a semiconductor device. The method includes the following steps. A substrate is placed within a reacting chamber. The substrate has an objective layer on which a metal silicide film is to be formed. Afterwards, a first source gas for silicon component of the metal silicide and a second source gas for metal component of the metal silicide into the reacting chamber with maintaining a constant flow rate of the first source gas and with varying a flow of the second source gas. The first and second source gases are discretely supplied into the reacting chamber, and a reacting zone of the reacting chamber is maintained at a constant temperature range. When the silicide film is formed through three stages of initial, middle, and end stages, the silicide film has an uniform tungsten to silicon ratio through the thickness of the film due to decrease in a flow of the second source gas at the middle stage compared with at the initial and end stages.

BRIEF DESCRIPTION OF THE DRAWINGS

These and other feature, aspects, and advantages of the present invention will become better understood with reference to the following description, appended claims, and accompanying drawings where:

DETAILED DESCRIPTION OF THE INVENTION

Hereinbelow, a method for forming a silicide film in accordance with the present invention will be described with reference to the enclosed drawings.

A semiconductor substrate having an objective layer on which a metal silicide film is to be formed is placed within a reacting chamber. The metal element in the metal silicide is selected from a group of transition metal including Ti, Ta, W, Ag, Au, and etc. Afterwards, a first source gas for silicon component of the metal silicide and a second source gas for metal component of the metal silicide are introduced into the reacting chamber with maintaining a constant flow rate of the first source gas and with varying the flow rate of the second source gas. In introducing the source gases, the chamber maintains a vacuum state continuously until the completion of formation of the metal silicide film to a targeted thickness. The first and second source gases are discretely supplied into the reacting chamber, a reacting zone of the reacting chamber being maintained at a constant temperature range, to react the silicon component of the first source gas with the metal component of the second source gas. Single crystal silicon, amorphous silicon, polysilicon, silicon oxide or another semiconductor material not having silicon component can be used as the objective layer. It is preferred to supply the first and second source gases through three stages of initial, middle, and end stages. More perferably, during a first break period between the first step and the second step and a second break period between the second step and the third step, the supply of the source gases must be stopped Hereinbelow, a method for forming tungsten silicide film on polysilicon layer used as word lines or bit lines, will be described. In this embodiment, monosilane ($SiH_4$) gas is used as the first source gas for silicon component and tungsten hexa-fluoride ($WF_6$) is used as the second source gas for metal component.

First, a semiconductor substrate is placed within a reacting chamber, the chamber being maintained under the conditions of a temperature range of 380–400° C., and a $SiH_4$ gas flow rate of 380–420 sccm(sccm=standard cubic centimeter per minute) for 10 seconds. Afterwards, a first silicidation step for forming tungsten silicide film at a first selected thickness, is performed using the conditions of $SiH_4$ gas flow rate 380–420 sccm and $WF_6$ gas flow rate of 4.2–4.4 sccm, the two source gas flow time 8 seconds, and a temperature range of 380–400° C., and the two gases react with each other to form a first tungsten silicide film.

After the first silicide film is deposited, a first purge step is performed to the substrate, at temperature range of 380–420° C. for 10 seconds without introducing the two source gases into the chamber.

Figure 1:
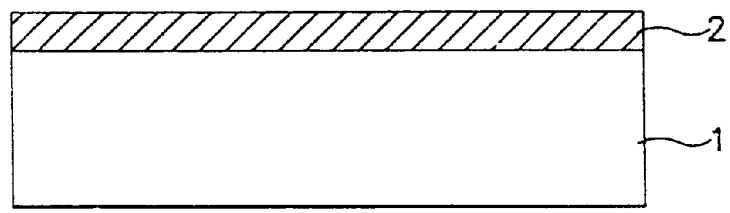
FIG. 1 is a partial sectional view of a semiconductor device on which a silicide film in accordance with the conventional art, is formed.
Figure 2:
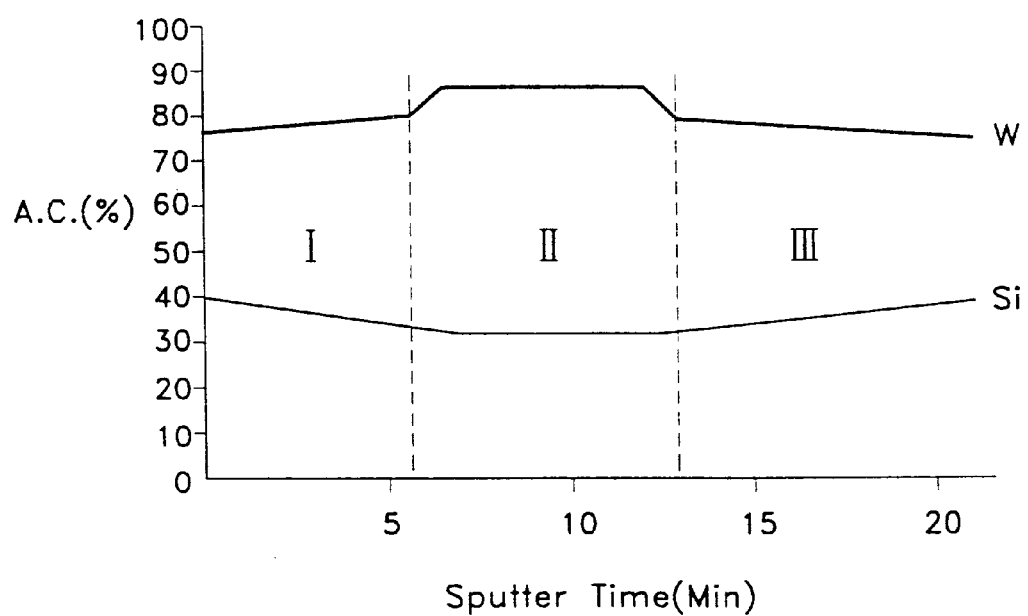
FIG. 2 is a graph showing AUGER analysis results of the silicide film of FIG. 1.

Next, with maintaining temperature of the reacting chamber to be the same with that of the first purge step, a second silicidation step for forming tungsten silicide film at a second selected thickness, where $SiH_4$ gas at a flow rate of 380–420 sccm and $WF_6$ gas at a flow rate of 3.9–4.1 sccm are introduced together into the chamber for 26 seconds, to thereby form a second tungsten silicide film. At this time, the flow rate of $WF_6$ gas should be lower than that of first silicidation step. The reason is because the same flow rate of $WF_6$ gas through three silicidation stages makes a mole ratio of tungsten to silicon of the middle thickness portion of the finalized silicide film to be higher than that of the surface and the bottom portion films of the finalized silicide film. This will be apparant by comparing AUGER analysis results shown in FIG. 2 with AUGER analysis results shown in FIG. 3.

Thereafter, a second purge step is performed to the substrate, for 10 seconds at temperature range of 380–420° C. without introducing the two source gases into the chamber. Afterwards, a third silicidation step for forming tungsten silicide film at a third selected thickness is performed at the same condition with the first silicidation step, to thereby form a third tungsten silicide film at a third selected thickness. Thereafter, silicon capsulation step is performed to form a thin silicon film on the tungsten silicide film formed in the third silicidation step at temperature range of 380–420° C. for 10 seconds with introducing only $SiH_4$ gas into the chamber. The thin silicon film is to stabilize the first, second and third tungsten silicide film to a phase having a mole ratio of tungsten to silicon of 1:2.2–2.3. The capsulation step can be selectively performed.

Figure 3:
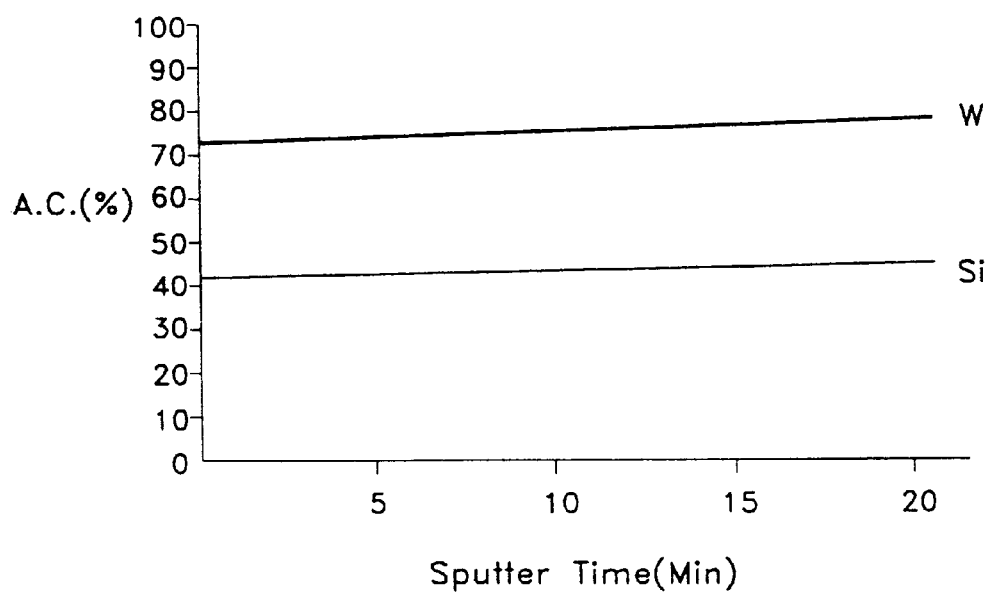
FIG. 3 is a graph showing AUGER analysis results of a silicide film formed in accordance with the present invention.

FIG. 3 shows AUGER analysis results of $WSi_x$ film deposited on polysilicon layer according to the above mentioned method, in which a horizontal axis is a sputter time taken in etching WSix film from its surface to the bottom and the vertical axis is a mole ratio of tungsten to silicon component.

Referring to FIG. 3, it is shown that respective atomic concentrations of the tungsten component and the silicon component are almost same at any thickness portions. A mole ratio of tungsten to silicon of 1:2.2–2.3 is obtained from the above results through the thickness of the $WSi_x$ film.

Meanwhile, when applying the method of the present invention to another embodiment, it is possible to delete the first and the second purge steps.

Although the embodiment has been described regarding to tungsten silicide, it is also possibe to apply a method of utilizing another transition metal material to the manufacture of a semiconductor device requiring a low resistivity.

As described previously, the present invention makes it possible to form a silicide film having a uniform mole ratio and low resistivity through its thickness by decreasing a flow rate of the source gas for the metal component contained in silicide film at the middle stage compared with that at the initial and end stages when forming a silicide film through three stages of initial, middle, and end stages. The silicide film formed according to the present invention improves the characteristic of semiconductor device as applied.

While specific embodiments of the invention have been described in considerable detail, it is to be understood that variations and modifications of these embodiments can be effected without departing from the spirit and scope of the invention as described and claimed.

What is claimed is:

1. A method for forming a silicide film of a semiconductor device, the method comprising the steps of:
   placing a substrate within a reacting chamber, the substrate having an objective layer on which a metal silicide film is to be formed; and
   supplying a first source gas for silicon component of the metal silicide and a second source gas for metal component of the metal silicide into the reacting chamber with maintaining a constant flow rate of the first source gas and with varying a flow rate of the second source gas, wherein the first and second source gases are discretely supplied into the reacting chamber, a reacting zone of the reacting chamber being maintained at a constant temperature range for a selected time.

2. The method as claimed in claim 1, wherein the source gases are introduced through three stages of initial, middle, and end stages.

3. The method as claimed in claim 2, wherein said source gases comprise as the second source gas, a gas containing a tungsten component and as the first source gas, a gas containing a silicon component.

4. The method as claimed in claim 3, wherein said gas containing the tungsten component is $WF_6$ and said gas containing the silicon component is $SiH_4$.

5. The method as claimed in claim 4, wherein the flow rate of said $SiH_4$ gas is maintained constant for initial, middle, and end stages, and the flow rate of $WF_6$ gas for the middle stage is lower than the flow rates of $WF_6$ gas for the initial and the end stages.

6. The method as claimed in claim 4, wherein the flow rates of said $SiH_4$ gas and said $WF_6$ gas for initial and end stages are respectively 380–420 sccm and 4.2–4.4 sccm in that order, and the flow rates of said $SiH_4$ gas and said $WF_6$ gas for middle stage are respectively 380–420 sccm and 3.9–4.1 sccm in that order.

7. The method as claimed in claim 2, further comprising a purge step which exhausts the remaining source gases out of the reacting chamber without supplying said source gases after the initial and middle stages are respectively completed, wherein said purge step is performed at a temperature range of 380–400° C.

8. The method as claimed in claim 7, further comprising a capsulation step which forms thin silicon film on the silicide film formed at the end stage, wherein the temperature within the reacting chamber is maintained at 380–400° C. and the first source gas continues to be supplied into the reacting chamber at a flow rate of 380–420 sccm.

9. The method as claimed in claim 8, wherein said second source gas is $SiH_4$.

10. The method as claimed in claim 1, where said objective layer is comprised of one selected from a group consisting of single crystal silicon, silicon oxide, amorphous silicon, and polysilicon.

11. The method as claimed in claim 10, wherein said objective layer is of polysilicon.

* * * * *